United States Patent
Stiefel

(10) Patent No.: US 9,603,237 B2
(45) Date of Patent: Mar. 21, 2017

(54) SURGE ARRESTER FOR AN ELECTRIC MACHINE

(71) Applicant: Robert Bosch GmbH, Stuttgart (DE)

(72) Inventor: Tobias Stiefel, Baden-Baden (DE)

(73) Assignee: Robert Bosch GmbH, Stuttgart (DE)

( * ) Notice: Subject to any disclaimer, the term of this patent is extended or adjusted under 35 U.S.C. 154(b) by 100 days.

(21) Appl. No.: 14/424,831

(22) PCT Filed: Aug. 6, 2013

(86) PCT No.: PCT/EP2013/066442
§ 371 (c)(1),
(2) Date: Feb. 27, 2015

(87) PCT Pub. No.: WO2014/032914
PCT Pub. Date: Mar. 6, 2014

(65) Prior Publication Data
US 2015/0230332 A1    Aug. 13, 2015

(30) Foreign Application Priority Data
Sep. 3, 2012 (DE) .................. 10 2012 215 557

(51) Int. Cl.
*H05K 1/02* (2006.01)

(52) U.S. Cl.
CPC ........... *H05K 1/0259* (2013.01); *H02K 11/26* (2016.01); *H05K 2201/10204* (2013.01)

(58) Field of Classification Search
CPC ....... H05K 1/0259; H05K 2201/10204; H02K 11/26

USPC ............................................. 361/56
See application file for complete search history.

(56) References Cited

U.S. PATENT DOCUMENTS

2008/0174923 A1* 7/2008 Wu ................... H01L 27/0255
361/56
2009/0251841 A1   10/2009 Whalin et al.

FOREIGN PATENT DOCUMENTS

| DE | 102007029906 | 1/2008 |
| DE | 102009015962 | 11/2009 |
| EP | 1120888 | 8/2001 |
| JP | 6110945 | 1/1986 |

OTHER PUBLICATIONS

International Search Report for Application No. PCT/EP2013/066442 dated Jan. 7, 2014 (English Translation, 2 pages).

* cited by examiner

*Primary Examiner* — Thienvu Tran
*Assistant Examiner* — Kevin J Comber
(74) *Attorney, Agent, or Firm* — Michael Best & Friedrich LLP

(57) ABSTRACT

Surge arrester for a an electric machine, comprising a dummy component (2) which is, compared to components on a circuit board (1) of the electric machine, mounted at the shortest distance from a discharge element (4) of the electric machine, the dummy component (2) being connected to earth potential in at least one terminal.

16 Claims, 1 Drawing Sheet

SURGE ARRESTER FOR AN ELECTRIC MACHINE

BACKGROUND OF THE INVENTION

The invention relates to a surge arrester for an electric machine.

It is known from the prior art that capacitors or suppressor diodes are used as surge arresters at pins of electronic components for the purpose of protecting against electrostatic discharge (ESD) by discharging an ESD pulse to ground.

In addition, the prior art discloses discharge paths on housings of electronic components which are implemented by means of capacitors to earth potential or directly from the housings to earth potential.

The German patent application DE 10 2009 015 962 A1 discloses an electrostatic discharge protection which is provided in the form of a discrete array comprising a voltage variable material or a device comprising voltage variable material. The array is produced having a common electrode for connecting to ground and one or a plurality of electrodes which are configured for connecting to an electrical component. The electrical component is a connector which is mounted to an electrical circuit which contains devices that are subject to damage by ESD events.

SUMMARY OF THE INVENTION

It is the aim of the present invention to provide an electric machine with an improved protective device against electrostatic discharge.

The aim is met by a surge arrester for an electric machine, comprising:
a dummy component which is, compared to components on a circuit board of the electric machine, mounted at the shortest distance from a discharge element of the electric machine, the dummy component being connected to earth potential in at least one terminal. A preferred discharge path is advantageously formed in this manner, on which a flashover of an electrostatic discharge occurs with a high degree of probability from the discharge element to the non-functional dummy component. An electronic component to be protected and thereby the entire electric machine are therefore advantageously protected against the damaging effects of the ESD discharge.

A preferred embodiment of the surge arrester is characterized by the fact that the dummy component is disposed on the circuit board of the electric machine. A protection can thereby be advantageously provided in a particularly simple manner for an electronic component to be protected which is likewise disposed on the circuit board. In addition, the dummy component can thereby be particularly easily disposed within the electric machine.

A preferred embodiment of the surge arrester is characterized by the fact that the dummy component is connected at all electrical terminals to the earth potential. In so doing, a particularly good protective or grounding effect is achieved for an ESD flashover.

A preferred embodiment of the surge arrester according to the invention provides that the dummy component projects above all other components on the circuit board. As a result, a minimum distance to the discharge element is provided, whereby an expected flashover behavior can easily be configured simply due to the geometric dimensions of the dummy component.

A preferred embodiment of the surge arrester is characterized by the fact that the dummy component is present in a parts list of the circuit board. In so doing, low additional costs for the implementation of the surge arrester result. No additional component is required in a manufacturing process and a standard process can thus advantageously be used.

A preferred embodiment of the surge arrester according to the invention provides that the earth lead on the circuit board is disposed in such a way that it forms as short a path as possible on the circuit board. As a result, the discharge energy can advantageously be discharged over a short distance, so that said energy cannot endanger other elements on the circuit board. In this way, electrical voltage peaks can substantially be kept away from components of the circuit board to be protected in an advantageous manner.

A preferred embodiment of the surge arrester according to the invention is characterized by the fact that the dummy component is a ceramic capacitor. Such components are as a rule, in terms of geometry, the tallest components on a printed circuit board, so that a cost effective option is thereby provided in a manufacturing process for implementing a surge arrester.

Provision is made in an advantageous modification to the discharge arrester for the dummy component to be an electrical resistor. In doing so, a type of component is also provided which is already present in a manufacturing process and thereby allows for a cost effective and efficient configuration of the surge arrester.

Provision is made in a preferred embodiment of the surge arrester according to the invention for the dummy component to be a contacting pin. As a result, a particularly simple and cost effective option for implementing an embodiment of the invention is provided.

By means of the device according to the invention, a safety level for the electric machine is raised to the extent that ESD discharge processes occurring during operation cannot damage elements of the electrical machine to be protected. An error-free service life of the electric machine can thereby be substantially lengthened in an advantageous manner. An additional expenditure of effort and money for preparing the inventive surge arrester is advantageously very low.

BRIEF DESCRIPTION OF THE DRAWINGS

The invention comprising further features and advantages is described below in detail with the aid of the two figures. In so doing, all of the features described or depicted form in isolation or in any desired combination the subject matter of the invention independently of the summarization or the retroactive application thereof in the patent claims as well as independently of the formulation or depiction thereof in the description or the drawings. The drawings are primarily intended to clarify the principles essential to the invention and are not necessarily accurate in every detail or true to scale.

In the drawings.

DETAILED DESCRIPTION

Figure 1:
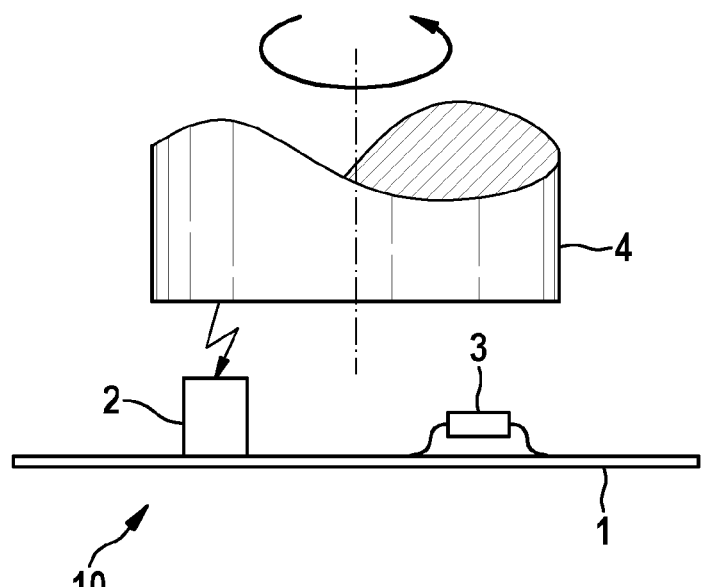
FIG. 1 shows a basic front view of an embodiment of the surge arrester according to the invention.

In a basic front view, FIG. 1 shows a basic depiction of an embodiment of the inventive surge arrester for an electric machine. An electrostatic discharge flashover can occur from a shaft 4 of the electric machine, which can be rotated about a rotational axis, to electric or electronic components which are disposed on a circuit board 1 beneath the shaft 4. This is, for example, due to the fact that a thin film of oil arises on the shaft 4 during the operation of the electric machine, whereby a low-resistance electrically conductive connection to an earth potential (e.g. housing ground) is prevented. In this way, an excess of charge occurs over time which, in a discharge process (ESD spark), discharges onto a sensor element 3 disposed below the shaft 4, which element can thereby be damaged or destroyed. During normal operation of the electric machine, angular positions and/or rotational speeds of the shaft 4, which drives a wiper arm of a motor vehicle, are ascertained with the sensor element 3. To this end, a magnet (not depicted) can, for example, be pressed onto the shaft 4.

Provision is now made according to the invention for a dummy component 2 to be provided on the circuit board 1 in the proximity of the sensor element 3, said dummy component being designed and disposed on the circuit board 1 such that it is, compared to other components on the circuit board 1, mounted at a minimum distance from the shaft 4. In this way, an electrostatic flashover will take place with a high degree of probability onto the dummy component 2, whereby the sensor element 3 to be protected will not be damaged or destroyed. Provision is therefore made according to the invention for the dummy component 2 to project above the component or components to be protected, wherein a protective effect is all the greater, the more the dummy component 2 projects above the element to be protected.

As an example for the dummy component 2, a ceramic capacitor, a resistor, a contacting pin etc. should come into consideration. In an advantageous manner, a protective effect is strictly dependent on geometric external dimensions of the dummy component 2, the dummy component 2 not being integrated into a functional operation of the electric machine. It is therefore advantageous for the dummy component 2 to be a cost effective component which is typically already present in a parts list of the circuit board 1 of the electric machine and therefore does not generate any additional costs.

Figure 2:
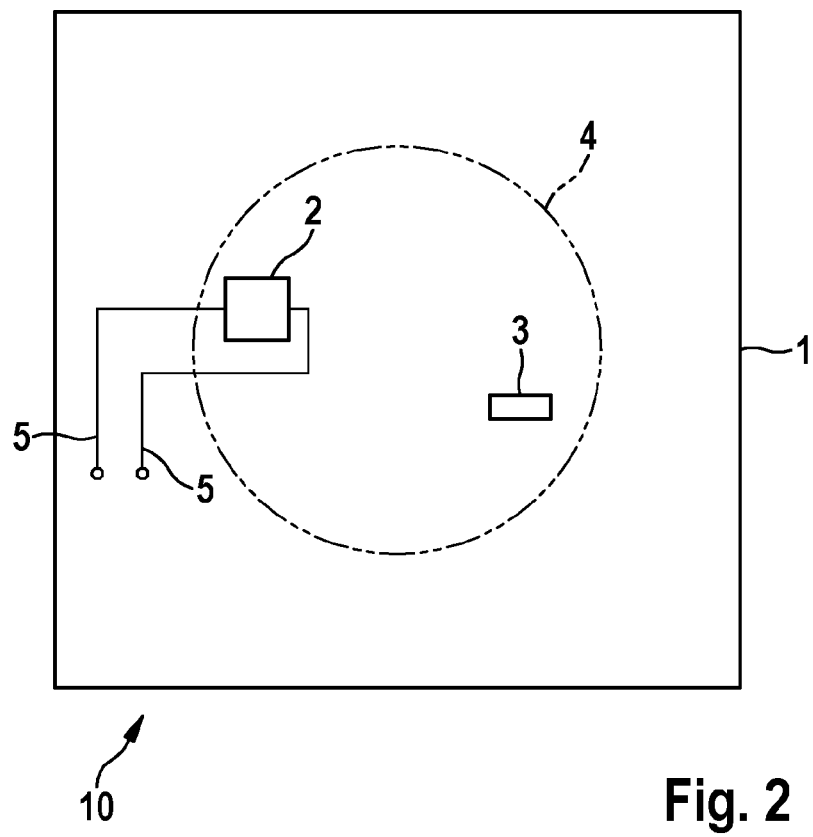
FIG. 2 shows a basic top view of an embodiment of the surge arrester according to the invention.

FIG. 2 shows a basic top view of an embodiment of the surge arrester 10 according to the invention. It can be seen that the dummy element 2 is connected on both sides by means of electric leads 5 of the circuit board 1 such that said leads 5 lead away from the dummy component 2 across a short distance or, respectively, are implemented with the shortest possible routing on the circuit board 1. The leads 5 are preferably routed to a ground neutral point which collects the electrostatic discharge energy and discharges the same by means of vias to a plug (not depicted) and thus away from the circuit board 1. In an advantageous manner, harmful electrical voltage peaks can substantially be kept away from functional components of the circuit board 1. The leads 5 should preferably be configured with as low a resistance as possible.

In summary, the invention provides a simple and efficient option for protecting components or entire assemblies on a circuit board of an electric machine from electrostatic discharges. This is advantageously achieved by means of the geometric dimensions of a dummy component which is designed such that it provides a minimum distance between end points of a discharge path of the electric machine. An ESD spark, which, for example, arises from electrostatic charge as a result of a wiping operation on a dry window pane, can in this way be harmlessly conducted along a minimally short and low-resistance path within a wiper motor.

A person skilled in the art can recognize that the inventive principle is not limited to an electric machine comprising a rotating shaft but can similarly be applied to those devices in which electrostatic discharges can occur and/or in which a defined ESD flashover path is to be generated. It is, for example, not absolutely necessary for the dummy component to be disposed directly on the circuit board.

The person skilled in the art will be able to combine the features described or modify said features without deviating from the gist of the invention.

The invention claimed is:

1. A surge arrester for an electric machine, comprising a dummy component (2) which is, compared to components including a sensor element (3) on a circuit board (1) of the electric machine, the dummy component mounted at a shortest distance from a rotatable shaft (4) that acts as a discharge element of the electric machine, the dummy component (2) being connected to earth potential at all electric terminals thereof.

2. The surge arrester according to claim 1, characterized in that the dummy component (2) is disposed on the circuit board (1) of the electric machine.

3. The surge arrester according to claim 2, characterized in that the dummy component (2) projects above all other components on the circuit board (1) toward the rotatable shaft.

4. The surge arrester according to claim 2, characterized in that the dummy component (2) is present in a parts list of the circuit board (1).

5. The surge arrester according to claim 2, characterized in that an earth lead on the circuit board (1) is disposed such that said lead forms as short a path as possible on the circuit board (1).

6. The surge arrester according to claim 1, characterized in that the dummy component (2) is a ceramic capacitor.

7. The surge arrester according to claim 1, characterized in that the dummy component (2) is an electrical resistor.

8. The surge arrester according to claim 1, characterized in that the dummy component (2) is a contacting pin.

9. An electric machine comprising a circuit board, a rotatable shaft that acts as a discharge element and a surge arrestor including a dummy component (2) which is, compared to components including a sensor element (3) on the circuit board (1), mounted at a shortest distance from the rotatable shaft (4), the dummy component (2) being connected to earth potential at all electric terminals.

10. The electric machine according to claim 9, characterized in that the dummy component (2) is disposed on the circuit board (1) of the electric machine.

11. The electric machine according to claim 10, characterized in that the dummy component (2) projects above all other components on the circuit board (1) toward the rotatable shaft.

12. The electric machine according to claim 10, characterized in that the dummy component (2) is present in a parts list of the circuit board (1).

13. The electric machine according to claim 10, characterized in that an earth lead on the circuit board (1) is disposed such that said lead forms as short a path as possible on the circuit board (1).

14. The electric machine according to claim 9, characterized in that the dummy component (2) is a ceramic capacitor.

15. The electric machine according to claim 9, characterized in that the dummy component (2) is an electrical resistor.

16. The electric machine according to claim 9, characterized in that the dummy component (2) is a contacting pin.

* * * * *